(12) United States Patent
Yoo (10) Patent No.: US 7,977,133 B2
(45) Date of Patent: Jul. 12, 2011

(54) METHOD OF FABRICATING VERTICAL STRUCTURE COMPOUND SEMICONDUCTOR DEVICES

(75) Inventor: Myung Cheol Yoo, Pleasanton, CA (US)

(73) Assignee: Verticle, Inc., Dublin, CA (US)

( * ) Notice: Subject to any disclaimer, the term of this patent is extended or adjusted under 35 U.S.C. 154(b) by 1046 days.

(21) Appl. No.: 11/367,229

(22) Filed: Mar. 2, 2006

(65) Prior Publication Data

US 2006/0148115 A1 Jul. 6, 2006
US 2008/0254561 A2 Oct. 16, 2008

(51) Int. Cl.
*H01L 21/00* (2006.01)

(52) U.S. Cl. ............ 438/46; 438/22; 438/455; 438/478; 257/99; 257/615; 257/E29.089; 257/E21.094; 257/E21.294

(58) Field of Classification Search ............ 438/22, 438/23, 46, 455, 458, 459, 460, 464, 478, 438/479, 483; 257/99, 103, 615, E29.089, 257/E29.144, E29.149, E29.249, E21.094, 257/E21.099, E21.104, E21.113, E21.294
See application file for complete search history.

(56) References Cited

U.S. PATENT DOCUMENTS

| | | | |
|---|---|---|---|
| 3,453,722 A | 7/1969 | Ramsey, Jr. et al. | |
| 4,999,694 A | 3/1991 | Austin et al. | |
| 5,331,180 A | 7/1994 | Yamada et al. | |
| 5,912,477 A | 6/1999 | Negley | |
| 5,990,495 A | 11/1999 | Ohba | |
| 6,187,606 B1 | 2/2001 | Edmond et al. | |
| 6,201,262 B1 | 3/2001 | Edmond et al. | |
| 6,232,623 B1 | 5/2001 | Morita | |
| 6,281,867 B2 | 8/2001 | Kurematsu et al. | |
| 6,331,208 B1 * | 12/2001 | Nishida et al. | 117/89 |
| 6,455,340 B1 | 9/2002 | Chua et al. | |
| 6,459,100 B1 | 10/2002 | Doverspike et al. | |
| 6,562,648 B1 * | 5/2003 | Wong et al. | 438/46 |
| 6,610,551 B1 | 8/2003 | Doverspike et al. | |
| 6,713,789 B1 | 3/2004 | Shibata et al. | |
| 6,756,614 B2 | 6/2004 | Hatano et al. | |
| 6,818,531 B1 * | 11/2004 | Yoo et al. | 438/458 |

(Continued)

FOREIGN PATENT DOCUMENTS

JP 2005005421 A 1/2005

OTHER PUBLICATIONS

Schlain, D; McCawley, F. X. ; Smith, G. R. "electrodepositioin of titanium diboride coating", 1976.*

(Continued)

*Primary Examiner* — Khiem D Nguyen
*Assistant Examiner* — Su C Kim
(74) *Attorney, Agent, or Firm* — Edwards Angell Palmer & Dodge LLP; Kongsik Kim (57) ABSTRACT

A method of fabricating a vertical structure opto-electronic device includes fabricating a plurality of vertical structure opto-electronic devices on a crystal substrate, and then removing the substrate using a laser lift-off process. The method then fabricates a metal support structure in place of the substrate. In one aspects the step of fabricating a metal support structure in place of the substrate includes the step of plating the metal support structure using at least one of electroplating and electro-less plating. In one aspect, the vertical structure is a GaN-based vertical structure, the crystal substrate includes sapphire and the metal support structure includes copper. Advantages of the invention include fabricating vertical structure LEDs suitable for mass production with high reliability and high yield.

8 Claims, 12 Drawing Sheets

U.S. PATENT DOCUMENTS

| | | | |
|---|---|---|---|
| 6,967,981 B2 * | 11/2005 | Chua et al. | 372/46.01 |
| 7,015,117 B2 | 3/2006 | Urbanek | |
| 7,105,857 B2 | 9/2006 | Nagahama et al. | |
| 7,250,638 B2 | 7/2007 | Lee et al. | |
| 7,384,807 B2 | 6/2008 | Yoo | |
| 2001/0010941 A1 | 8/2001 | Morita | |
| 2001/0042866 A1 | 11/2001 | Coman et al. | |
| 2002/0001943 A1 | 1/2002 | Akram | |
| 2002/0036295 A1 | 3/2002 | Nunoue et al. | |
| 2002/0050596 A1 | 5/2002 | Otsuka et al. | |
| 2002/0052076 A1 | 5/2002 | Khan et al. | |
| 2002/0053676 A1 | 5/2002 | Kozaki | |
| 2002/0056914 A1 | 5/2002 | Akram | |
| 2002/0098711 A1 | 7/2002 | Klein et al. | |
| 2002/0102819 A1 | 8/2002 | Tamura et al. | |
| 2002/0102830 A1 | 8/2002 | Ishida | |
| 2002/0106879 A1 | 8/2002 | Akram | |
| 2002/0117677 A1 | 8/2002 | Okuyama et al. | |
| 2002/0146855 A1 | 10/2002 | Goto et al. | |
| 2002/0182889 A1 | 12/2002 | Solomon et al. | |
| 2003/0006429 A1 | 1/2003 | Takahashi et al. | |
| 2003/0040133 A1 | 2/2003 | Horng et al. | |
| 2003/0047129 A1 | 3/2003 | Kawahara et al. | |
| 2003/0080344 A1 | 5/2003 | Yoo | |
| 2003/0114017 A1 | 6/2003 | Wong et al. | |
| 2003/0122141 A1 | 7/2003 | Wong et al. | |
| 2003/0139037 A1 | 7/2003 | Kobayashi et al. | |
| 2003/0189212 A1 | 10/2003 | Yoo | |
| 2003/0189215 A1 | 10/2003 | Lee et al. | |
| 2004/0033638 A1 * | 2/2004 | Bader et al. | 438/46 |
| 2004/0072383 A1 | 4/2004 | Nagahama et al. | |
| 2004/0245543 A1 | 12/2004 | Yoo | |
| 2005/0082543 A1 | 4/2005 | Alizadeh et al. | |
| 2005/0189551 A1 | 9/2005 | Peng et al. | |
| 2005/0242365 A1 | 11/2005 | Yoo | |
| 2006/0006554 A1 | 1/2006 | Yoo | |
| 2006/0105542 A1 | 5/2006 | Yoo | |
| 2007/0221944 A1 | 9/2007 | Yoo | |

OTHER PUBLICATIONS

R.J. von Gutfeld; S.R. Vigliotti, "High-speed electroplating of copper using the laser-jet technique", 1985, appl. phys. lett. 46, 1003.*

"International Search Report", Issued in PCT Application No. PCT/US2005/41467; Mailing Date: May 19, 2008.

"Written Opinion", Issued in PCT Application No. PCT/US2005/41467; Mailing Date: May 19, 2008.

"International Report on Patentability", Issued in PCT Application No. PCT/US2005/041467; Mailing Date: Jul. 3, 2008.

"International Search Report", Issued in PCT Application No. PCT/US05/14634; Mailing Date: Aug. 4, 2008.

"Written Opinion", Issued in PCT Application No. PCT/US05/14634: Mailing Date: Aug. 4, 2008.

"Non Final Office Action", U.S. Appl. No. 11/165,110, Mailing Date: Jan. 7, 2009.

"First Office Action", China Application No. 200480018620.2, Mailing Date: Jul. 4, 2008.

"Second Office Action", Issued in Chinese Application No. 200580020642.7; Mailing Date: May 15, 2009.

"International Search Report", Issued in PCT Application No. PCT/US2008/065355; Mailing Date: Sep. 29, 2008.

"Written Opinion", Issued in PCT Application No. PCT/US2008/065355; Mailing Date: Sep. 29, 2008.

"International Preliminary Report on Patentability", Issued in PCT Application No. PCT/US/2005/014634; Mailing Date: Sep. 12, 2008.

International Preliminary Report on Patentability, mailed Jan. 4, 2007, for International Application No. PCT/US2004/017297; Filed on Jun. 3, 2004; Applicant: Yoo, Myung Cheol.

International Written Opinion, mailed Nov. 22, 2006, for International Application No. PCT/US2004/017297; Filed on Jun. 3, 2004; Applicant: Yoo, Myung Cheol.

International Written Opinion, mailed Oct. 2, 2006, for International Application No. PCT/US2005/22785; Filed on Jun. 22, 2005; Applicant: Verticle.

International Search Report, mailed Nov. 22, 2006, for International Application No. PCT/US2004/017297; Filed on Jun. 3, 2004; Applicant: Yoo, Myung Cheol.

International Search Report, mailed Oct. 2, 2006 for International Application No. PCT/US2005/22785; Filed on Jun. 22, 2005; Applicant: Verticle.

"Notice of Office Action," mailed Nov. 29, 2005, for U.S. Appl. No. 10/861,743, filed Jun. 3, 2004; Inventors: Yoo, Myung Cheol.

"Notice of Office Action," mailed Jun. 14, 2006, for U.S. Appl. No. 10/861,743, filed Jun. 3, 2004; Inventors: Yoo, Myung Cheol.

"Notice of Office Action," mailed Jun. 4, 2007, for U.S. Appl. No. 10/861,743, filed Jun. 3, 2004; Inventors: Yoo, Myung Cheol.

"Notice of Office Action," mailed Jan. 4, 2007, for U.S. Appl. No. 10/861,743, filed Jun. 3, 2004; Inventors: Yoo, Myung Cheol.

"Notice of Office Action," mailed Sep. 27, 2006, for U.S. Appl. No. 11/117,084, filed Apr. 27, 2005; Inventors: Yoo.

"Notice of Office Action," mailed Apr. 3, 2007, for U.S. Appl. No. 11/117,084, filed Apr. 27, 2005; Inventors: Yoo.

Wong, et al. "Continuous-Wave InGaN Multiple-Quantum-Well Laser Diodes on Copper Substrates," Feb. 26, 2001, Applied Physics Letters vol. 78, pp. 1198-1200, No. 9, http://apl.aip.org/apl/copyright.jsp.

Kneissl, et al. "Continuous-Wave Operation of InGaN Multiple-Quantum-Well Laser Diodes on Copper Substrates Obtained by Laser Liftoff," Mar./Apr. 2001, IEEE Journal on Selected Topics in Quantum Electronics, pp. 188-191, vol. 7, No. 2.

Worw, et al. "The Integration of $In_xGa_{1-x}N$ Multiple-Quantum-Well Laser Diodes with Copper Substrates by Laser Lift-Off," Dec. 1, 2000, Jpn. J. Appl. Phys. vol. 39 (2000), pp. L 1203-L 1205, Part 2, No. 12A.

"Non-Final Office Action", date mailed Nov. 15, 2007, U.S. Appl. No. 11/165,110, filed Jun. 22, 2005; Applicant: Verticle.

"Written Opinion", date mailed Dec. 7, 2007, International Application No. PCT/US05/22785; Filed on Jun. 22, 2005; Applicant: Verticle.

"International Preliminary Report on Patentability", issued in PCT Application No. PCT/US2008/065355; Mailing Date: Dec. 10, 2009.

* cited by examiner

METHOD OF FABRICATING VERTICAL STRUCTURE COMPOUND SEMICONDUCTOR DEVICES

RELATED APPLICATIONS

This application claims the priority right under 35 USC 120 from U.S. application No. 10/861,743, filed on Jun. 3, 2004, which claims the priority right from U.S. Provisional Patent Application No. 60/476,008 filed on Jun. 4, 2003, all of which are incorporated herein by reference.

FIELD

The invention is related to fabricate vertical structure compound semiconductor devices having a top and bottom contact structure.

BACKGROUND

Conventionally most GaN-based semiconductor devices that include Light Emitting Diode (LED), Laser Diode (LD), Hetero-junction Bipolar Transistor (HBT), High Electron Mobility Transistor (HEMT), are fabricated using insulating sapphire substrate. As a result, device structures constructed with insulating substrate are typically constructed into lateral structures since a top side n-contact must be formed to make an electrical connection with the top side p-contact.

This construction causes numerous device performance problems such as current crowding and weak resistance to electrostatic discharge (ESD). The current crowding can become critical when high current injection is required for lighting applications using high power white LEDs or a blue/UV LD. Since the electrons are confined near the n-type electrode in such devices, the photon generation in the optoelectronic devices is limited with respect to increased current injection. In other words, the power efficiency suffers. This is a critical drawback of lateral devices currently available in the market.

The ESD issue is considered a serious problem, particularly when GaN-based LEDs are employed in a high voltage environment, for example, in automobile applications. Once electrostatic charge occurs on the device surface, the lateral device experiences charge build up which often leads to device failure within very short period since there is no current discharge path in the device due to the insulating substrate.

The other critical disadvantage of lateral devices having an insulating substrate like sapphire is the poor heat dissipation. Sapphire is known to be a poor heat conductor. Hence, the device lifetime is significantly shortened when the device is subjected to a high current injection mode. These are two are critical hurdles for the further development of GaN-based LEDs and LDs, and blue/UV LDs.

Figure 1:
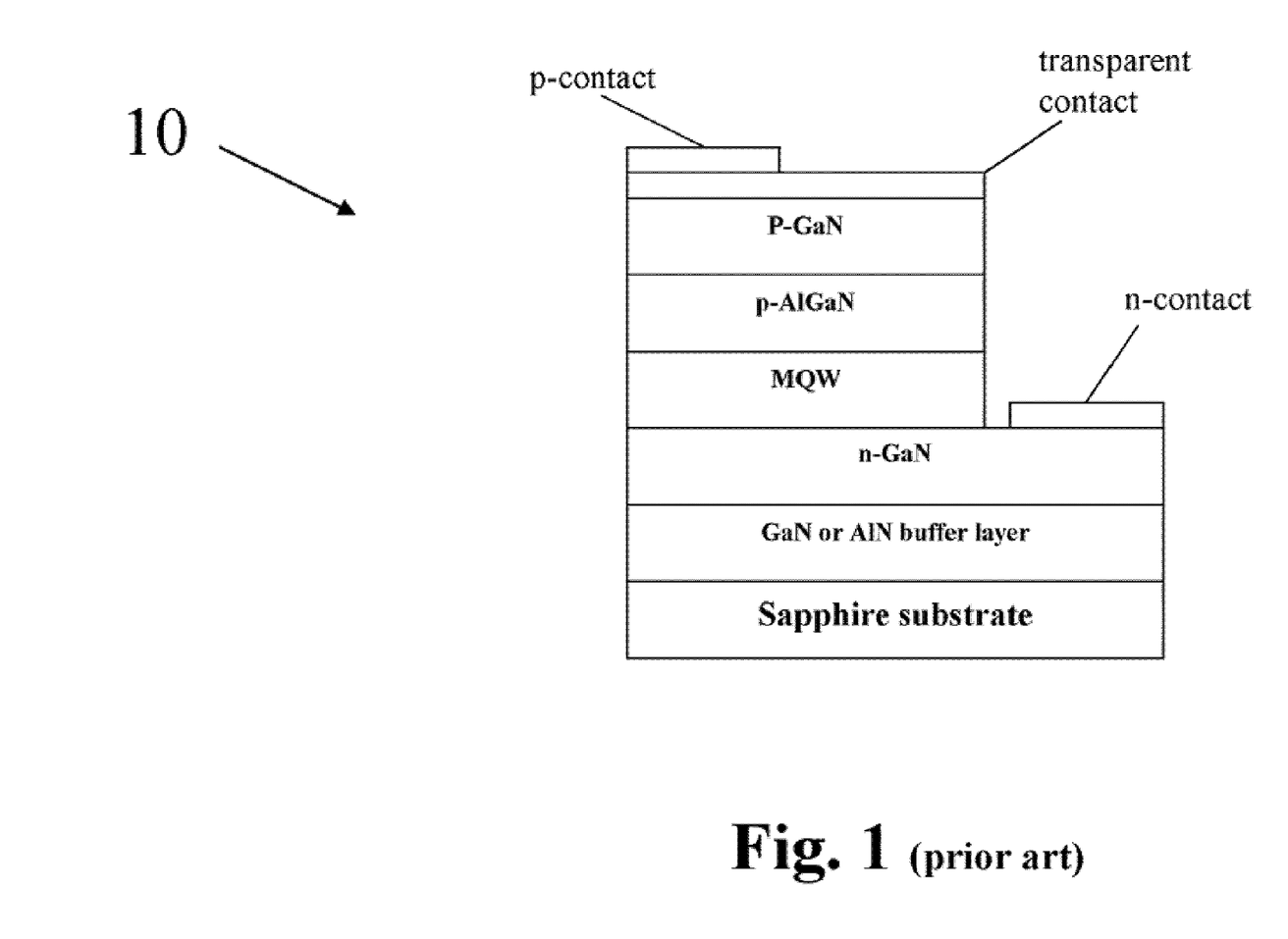
FIG. 1 shows conventional lateral structure GaN-based LED where two metal contacts are formed on the topside of device.

From the production yield point of view, the lateral structure device also has numerous disadvantages. Devices constructed with lateral structures need large device dimensions because both the p and n electrode are placed in the same plane as shown in FIG. 1. Hence the number of devices is limited due to the amount of wafer real estate the lateral devices require.

In addition to the issues raised above, sapphire substrate material is known to be the second hardest material, next to diamond. This causes difficulty in wafer grinding and polishing. Moreover, it is also difficult to separate the devices from the wafer. Therefore, even though one can expect high device yield rate up to front fabrication processes, the ultimate device fabrication yield is mainly dependent on post fabrication processes that include lapping, polishing, and die separation.

Figure 2:
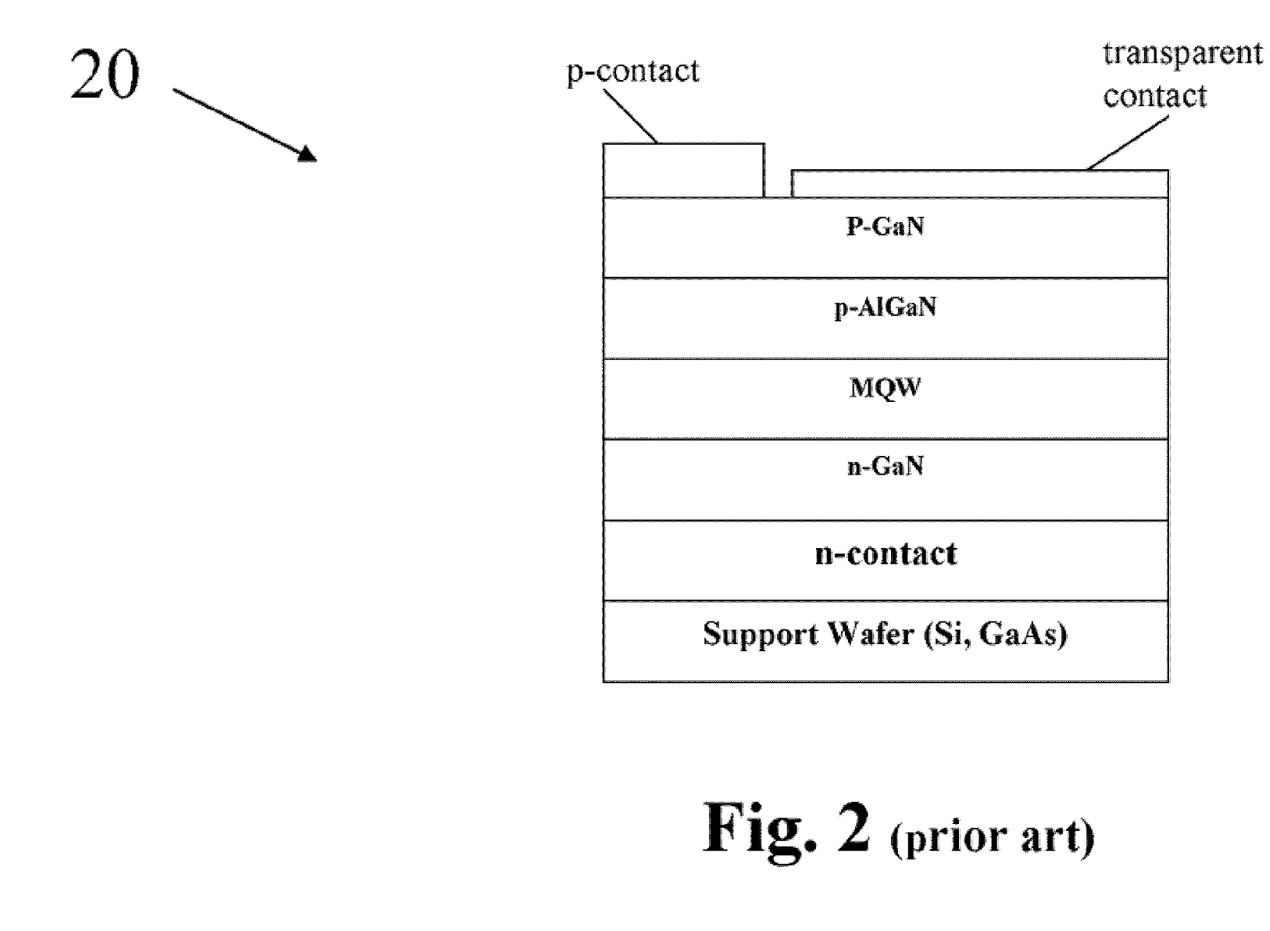
FIG. 2 is a vertical structure GaN-based LED according to another conventional technique, where GaN thin membrane is bonded to the second substrate, such as Si, GaAs, etc., using metal bonding layer after removing the original sapphire substrate.

Recently, there have been new developments concerning a vertical structure GaN-based compound semiconductor, depicted in FIG. 2. A laser lift-off process has been introduced to remove the sapphire substrate from the GaN epi layer. Some techniques have substituted the insulating sapphire substrate with a conductive or semi-conductive second substrate to fabricate vertical structure devices using an excimer laser with a wavelength transparent to sapphire, typically in the UV range. It is noted that most other techniques utilize wafer-bonding techniques for permanent bonding to the second substrate after removing sapphire substrate by laser lift-off.

However, these techniques have not resulted in a practical wafer scale laser lift-off process for the mass production of VLEDs (Vertical LED). The two main reasons are the difficulty in large area laser lift-off due to de-lamination of bonding adhesive layer between support wafer and the epitaxial layer. The other problem is the difficulty in wafer bonding between epitaxial layer and a permanent second substrate since the epitaxial layer surface is not flat on entire wafer surface after laser lift-off. Because of these reasons, the final yield after laser lift-off greatly hampered, as a result, only small fragment portion of wafers have been fabricated for vertical structure devices according to the other techniques.

There have been other efforts to overcome the wafer bonding problems to fabricate VLEDs. Instead using wafer bonding methods, one other technique shown in FIG. 3 attaches a metal support. However, the laser lift-off yield is known to be very low due to de-lamination of the bonding layer to the support structure. If the bonding is not secure enough to withstand the high-energy laser shock wave, the GaN epi layers may buckle or crack after laser lift-off. Once cracks or buckles exist on the GaN epi layer it is very difficult to perform a post laser lift-off process, such as cleaning, debonding, and device separation. Hence, final device process yield becomes very low even though the other process yield can maintain very high. These problems are mainly attributed to the temporary wafer bonding technique and non-optimized laser processing technique used.

Figure 3:
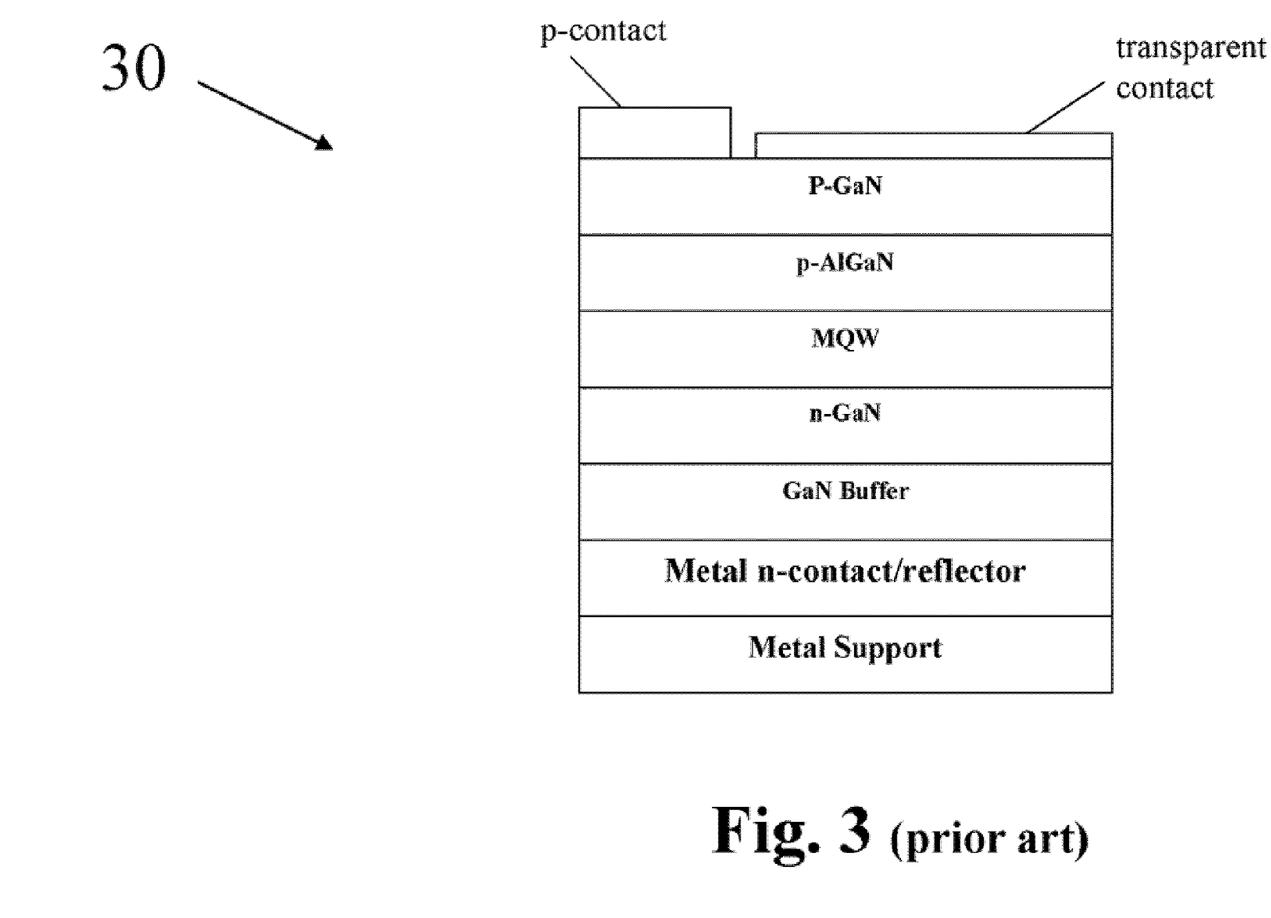
FIG. 3 is a vertical structure GaN-based LED according to another conventional technique, where instead of wafer bonding, thick metal layer is deposited onto the GaN thin membrane after removing the original sapphire substrate.
Figure 4:
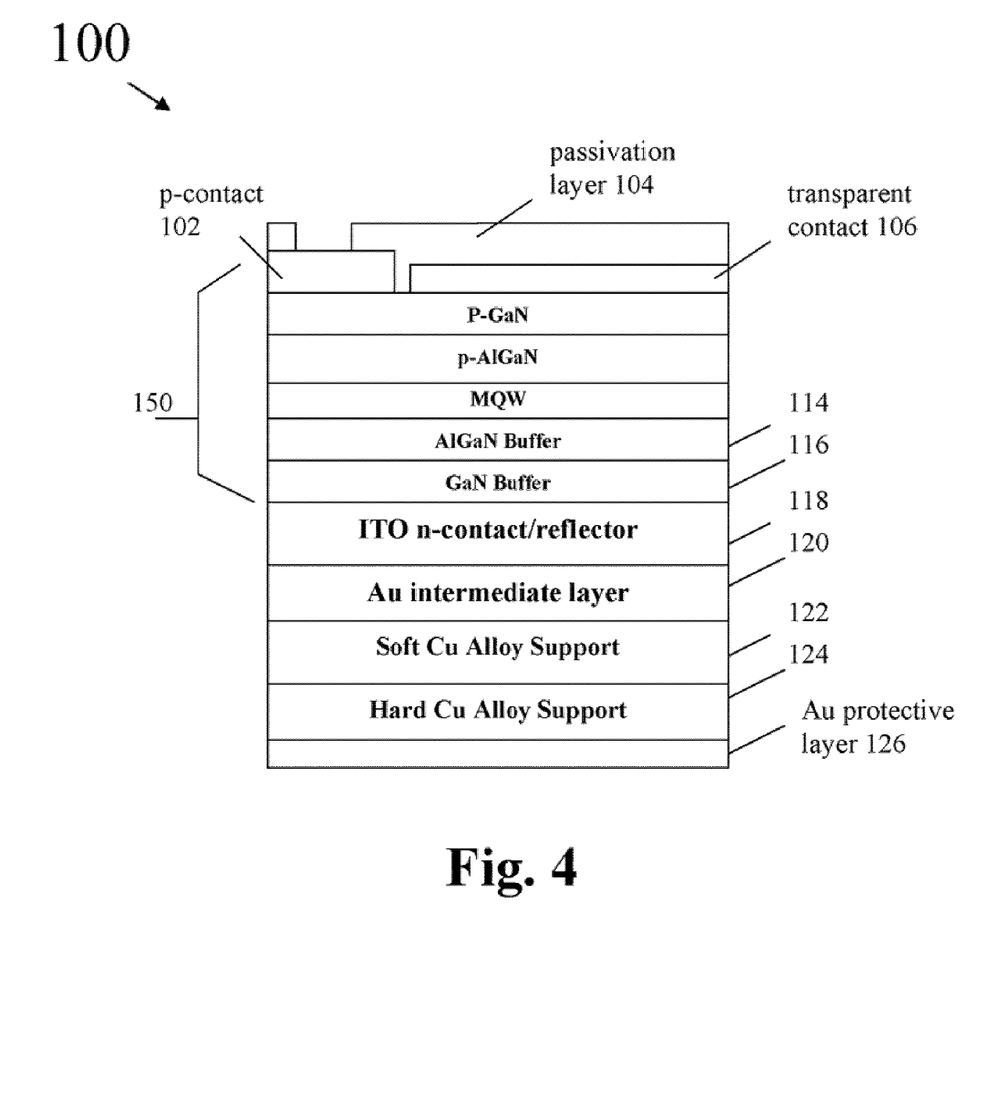
FIG. 4 is a vertical structure GaN-based LED according to the invention, where an AlGaN second buffer layer is added to the initial GaN/AlN buffer layer and an intermediate Au layer and a thick copper alloy layer is deposited to the ITO (Indium Tin Oxide) contact layer after removing the original sapphire substrate.

Another problem with conventional vertical devices based on another technique, shown in FIG. 3, is poor device performance. Since sand blasting is often used on the sapphire substrate to create a uniform laser beam energy distribution, the GaN surface after laser lift-off is very rough, which results in poor reflectivity of the device. In addition, the metal reflective layer formed on the n-GaN layer is not as high as non-metallic reflector material, such as ITO.

What is needed is a method of fabricating vertical structure compound semiconductor devices that provides a reliable and repeatable laser lift-off process while obtaining high device performance in order to apply laser lift-off process to the fabrication of vertical structure devices.

SUMMARY

The present invention provides improved technologies for fabricating a new vertical structure compound semiconductor devices using an improved laser lift-off processes for mass production of GaN-based compound semiconductor devices. One aspect of the invention employs a double bonding process for the temporary adhesive bonding to the support wafer and utilizes a AlGaN buffer layer in addition to the GaN initial buffer layer having certain epi thickness wafer to ensure reliable and repeatable laser lift-off process.

In one embodiment, the invention describes fabrication methods to construct a vertical structure compound semiconductor for mass production by optimizing a laser lift-off processes and metallization processes. First, in order to prevent thermal damages of polymer-base bonding adhesives during laser lift-off, AlGaN buffer layer and thick GaN epi layers (>5 µm), which serve as a diffusion barrier are used in addition to the conventional GaN or AlN buffer layer. Second, a double bonding technique is used to reduce the damages caused by high-energy laser shock wave and to help easy de-bonding process. Third, an Indium Tin Oxide (ITO) thin film is disposed between GaN epi layer and thick metal support layers to obtain high efficiency optical and electrical characteristics of vertical device Finally, graded Cu alloy-base thick metal support layers are used to obtain good mechanical support, high electrical conductivity, and good thermal dissipation of the vertical devices.

Advantages of the invention include fabricating vertical structure LEDs suitable for mass production with high reliability and high yield. The invention uses a double bonding process prior to laser lift-off process for the easy separation of the epitaxial layer and the support wafer after laser lift-off; and uses an AlGaN damping layer to guard against the high energy shock wave of the laser beam. This additional buffer layer reduces the crack generation caused by high-energy laser beam irradiation on the thin epitaxial thin film.

BRIEF DESCRIPTION OF THE DRAWINGS

The invention is described with reference to the following figures, in which.

DETAILED DESCRIPTION

The invention is described with reference to specific methods, techniques, device structures and embodiments. Those skilled in the art will recognize that the description is for illustration and to provide the best mode of practicing the invention. Moreover the parameters, thicknesses, temperatures and so forth are provided to describe the best mode for practicing the invention and are not intended to be limiting.

FIGS. 4 through 12 illustrate the procedures to fabricate vertical structure GaN-based LEDs 100 using a laser lift-off process according to the invention. This embodiment employs the laser lift-off procedure to remove the original substrate and the employ a metal deposition process to form a metal substrate for mechanical support and electrical conductivity. The fabrication method described in this invention is not limited to LEDs but can be extended to any device structures containing GaN-based epitaxial thin films grown on the insulating substrate, such as laser diodes (LD), Heterojunction Bipolar Transistor (HBT), High Electron Mobility Transistor (HEMT). These applications are exemplary because it is further anticipated that the invention is applicable to other or additional materials.

Figure 5:
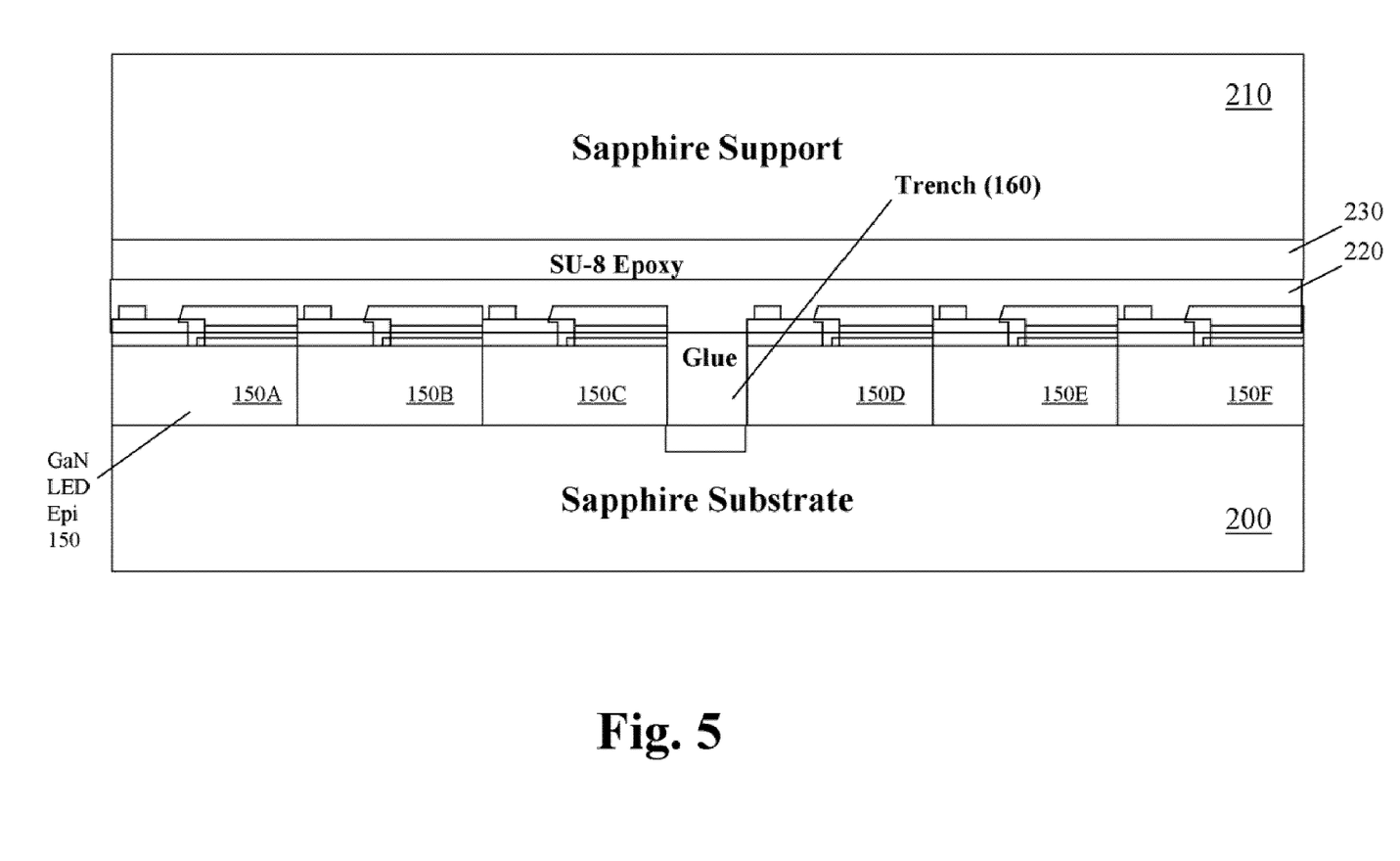
FIG. 5 shows a GaN-LED wafer attached to the sapphire support wafer using a glue/epoxy double adhesion layer prior to laser lift-off.

As shown in FIG. 5, the GaN-based LED structure 150A-150F is grown on sapphire wafer 200 with an appropriate epitaxial growth apparatus, such as metal organic chemical vapor deposition (MOCVD), molecular beam epitaxy (MBE) or vapor phase epitaxy (VPE), etc. Contrary to the conventional techniques where a single layer of GaN or AlN is a common buffer layer, the invention employs an AlGaN buffer layer 114 in addition to a GaN or AlN buffer layer 116. The AlGaN layer 114 is useful for creating a thermal barrier. The temperature at the interface between the GaN epitaxial layer and adhesive bonding layer may increase up to 250 C during the laser lift-off process. Therefore, the polymer-based adhesive layer will likely deteriorate and react with the GaN epitaxial layer during laser lift-off due to heat build up, which makes it difficult to remove the thermally deteriorated adhesives during a de-bonding process. The invention's employment of AlGaN helps to reduce the bonding adhesive deterioration, hence to improve device fabrication yield. In addition, the total epitaxial layer thickness is set to certain thickness to prevent a temperature increase at the GaN/adhesive interface. Beneficially, the epi layer thickness is chosen to be more than 5 µm in order to maintain an interfacial temperature below 200 C. To achieve this, the n-GaN layer is grown more than 4 µm thick. Other thicknesses and temperature variations are anticipated.

After the epitaxial growth, the fabrication processes includes metallization and passivation layer formations performed on the GaN epitaxial layer to form a metal contacts and to provide the protective layer. In particular, the trenches 160 are formed from the GaN LED layer through the sapphire substrate as shown in FIG. 5. The trenches are designed such a way to relieve compressive stress between the GaN epi layer 116 and sapphire substrate 200 during the laser lift-off, thus minimize cracking or buckling of the GaN epi layer during laser lift-off. The trench dimension is designed to be the same as the laser beam spot size, for example 7×7 mm, to relieve shock wave during the laser lift-off process. The trenches were beneficially narrower than about 100 µm wide and extend less than 2 µm into the sapphire substrate. The trenches are beneficially formed using reactive ion etching, preferably inductively coupled plasma reactive ion etching (ICP RIE) with mixture of Ar and $Cl_2$ or $BCl_3$ gas. After completing the fabrication process, the backside of the sapphire substrate is lapped and polished to obtain a smooth surface prior to laser lift-off.

Referring back to FIG. 5, the fully processed GaN-based LED wafer having a sapphire substrate 200 is bonded to the temporary support wafer in order to hold a very thin GaN epi membrane after the sapphire substrate removal by laser lift-off. In the invention, two layers of temporary bonding adhesives are used, glue 220 and epoxy 230. There are two reasons for using a double bonding technique. The first reason is to reduce damage resulting from shock waves from a high-energy laser beam. If the bonding is thin or weak, the GaN epitaxial layer after laser lift-off often results in a large number of cracks and buckled epi layer due to the shock waves from the laser beam, which significantly reduces laser lift-off process yield. The second reason is to help make the de-bonding process easier by using a first bonding layer with solvent soluble super glue and a second layer with high bonding strength and higher shock wave resistant. Because the super glue has weak bonding strength and resistance to shock waves, SU-8 5 epoxy is applied on the first super glue bonding layer. While Su-8 has much higher bonding strength and greater resistance to the shock wave than super glue it is difficult to remove once the SU-8 is fully cured.

The super glue layer is applied using spin coating with multiple spins so that the super glue layer thickness is maintained to a thickness of approximately 30 μm. After the super glue bonding, the SU-8 5 is applied on top of the super glue layer using spin coating with a thickness thicker than approximately 20 micron. The SU-8 5 is cured with a UV lamp through the sapphire support wafer 210. Using a UV light transparent sapphire support is useful for curing SU-8 5 epoxy since SU-8 5 is cured by the UV light. The following detailed process steps for temporary wafer bonding are provided for clarification of the best mode.

Super glue bonding process (on GaN/sapphire wafer 200);
1. Soak GaN/sapphire wafer in acetone, then soak in iso-propanol, blow dry with $N_2$.
2. Soak GaN/sapphire wafer in DI (De-ionized) $H_2O$, blow dry with $N_2$.
3, Apply super glue to approximately ⅓ to ½ of wafer in center.
4. Ramp spin coater quickly to 2000 rpm (1~2 seconds) and immediately ramp back down to zero.
5. Check for full coverage; if not fully covered, then fill in empty areas with super glue and repeat step 4.
6. Once wafer is fully covered with super glue, ramp to 2000 rpm and hold for 30 seconds
7. Ramp down to zero and stop.
8. Intra-layer curing for 2 minutes.
9. Repeat steps 3 thru 9 for 5 coats.
10. Cure super glue for recommended time (over night curing).

SU-8 5 bonding process (on sapphire support wafer 210);
1. Soak sapphire support wafer in acetone, then isopropanol, then DI $H_2O$ blow dry with $N_2$.
2. Dehydration bake of sapphire support wafer and GaN/sapphire wafer coated with super glue
2.1 Heat support wafer at 120 C with hot plate for 10 minutes
2.2 Remove from hot plate and cool down for 2 minutes
3 Apply SU-8 5 with injector to either sapphire support wafer (polished side) or GaN/sapphire wafer (super glue side)
4. Place other wafer on top of SU-8 5 drop and allow to naturally spread epoxy
5. Apply gentle pressure with tweezers; excess SU-8 5 squeezes out perimeter, which can be easily removed later with a razor blade or wafer edge trimmer,
6 Soft bake to remove solvents:
6.1 For ¼ wafers (on the hot plates)
6.1.1. 70 C—2.5 minutes
6.1.2. 90 C—5 minutes
6.1.3. 70 C—2 minutes
6.1.4. cool down on clean surface
6.2 for ½ to full wafers (on the hot plates)
6.2.1. 70 C—2.5 minutes
6.2.2. 90 C—10 minutes
6.2.3. 70 C—2 minutes
6.2.4. cool down on clean surface
7. UV exposure:
7.1 Using homogeneous UV source (such as UV lamp of the mask aligner)
7.1.1. Intensity: 7~7.5 $mW/cm^2$ on SU8 5 without sapphire support wafer.
7.1.2. Intensity: 5.0 $mW/cm^2$ on non-polished sapphire support wafer.
7.2 15 μm-thick film needs approximately 200 $mJ/cm^2$ dose (for 40 seconds at this intensity)
7.3 120 second exposure in case film is thicker (or 20 minute maximum exposure)
8. Hard baking for increasing cross-linking between SU8 5 and super glue:
8.1.1. 70 C—1 minutes
8.1.2. 90 C—2 minutes
8.1.3. cool on clean surface Referring to FIG. 6, a 248 nm KrF ultra violet (UV) excimer laser is used for laser lift-off. The exemplary laser has a pulse duration of 38 ns. The reason for choosing this wavelength is that the laser should transmit through the sapphire and be absorbed in the GaN epi layer in order to decompose the GaN into metallic Ga and the gaseous nitrogen ($N_2$) at the GaN/sapphire interface, The laser beam is chosen to have a 7×7 mm square beam and beam power density between 600~1,200 $mJ/cm^2$. It is also found that the required laser beam energy density is strongly dependent on the surface roughness of the sapphire substrate surface. In order to obtain a smooth GaN surface after laser lift-off the beam energy higher than 800 $mJ/cm^2$ is used. It is anticipated that these parameters may be varied with good results.

Figure 6:
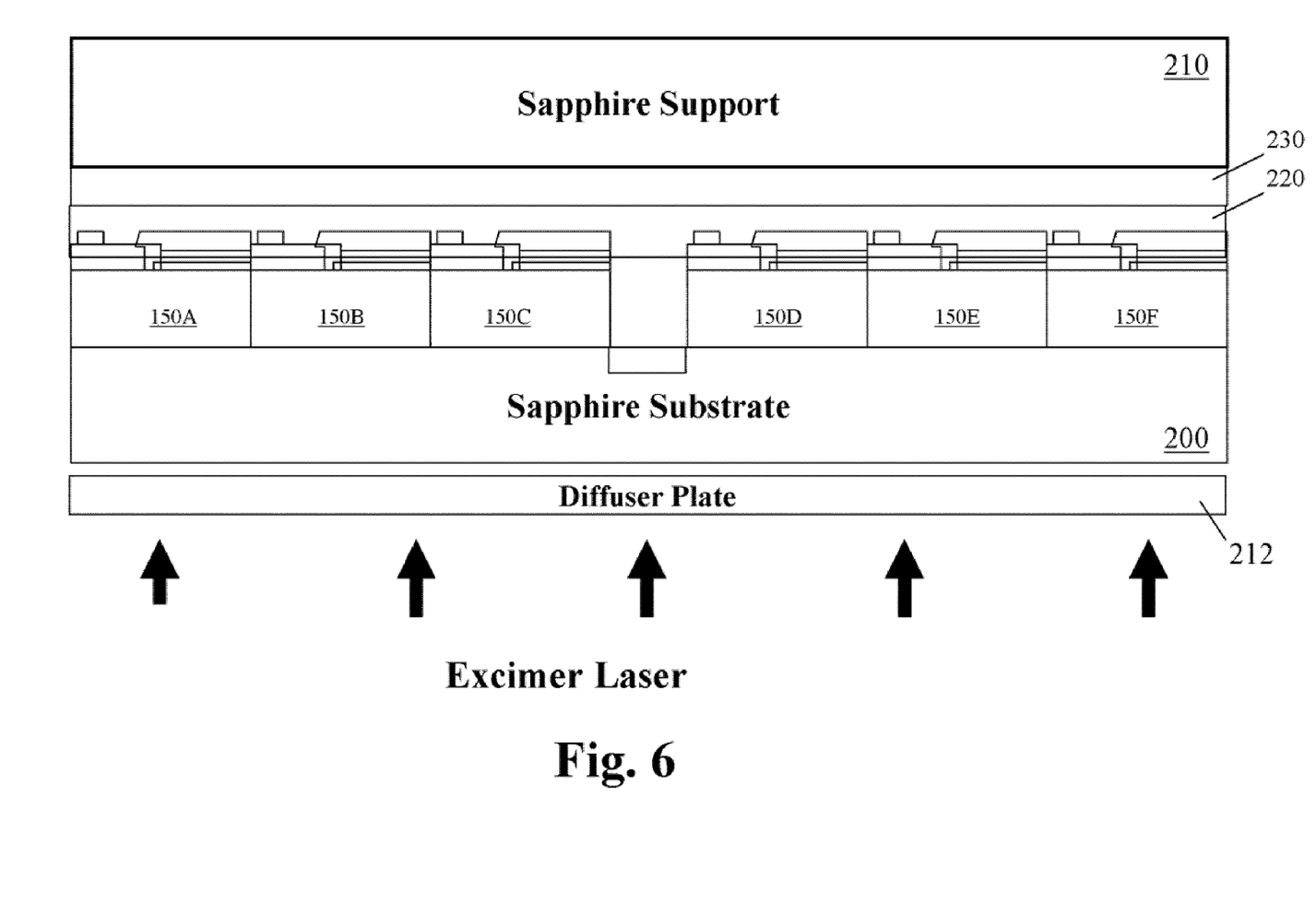
FIG. 6 shows a laser passing through the sapphire substrate using a diffuser plate.

Based on the previous experience) surface roughness of the sapphire substrate is found to be an important process parameter to obtain smooth GaN surface after laser lift-off. If an un-polished sapphire surface is used during the laser lift-off the GaN surface is very rough, which results in poor light out-put of the LED device due to poor reflectivity of the rough surface after forming a final device. However, if a polished surface is used a very smooth GaN surface can be obtained, hence higher light out-put can be obtained. However, since the laser beam is localized on the polished sapphire surface, the area irradiated with higher laser beam power usually results in cracking on the GaN surface compare to the area with less laser beam energy. Therefore, it is important to choose an optimal surface roughness of the sapphire wafer in order to obtain a high yield laser lift-off process and a high device performance at the same time. According to conventional techniques, sand blasting is commonly used to obtain uniform laser beam distribution on the polished sapphire surface, however, sand blasting is very unreliable and unrepeatable to obtain the same surface roughness each time. In the invention, a diffuser plate made out of materials transparent to the 248 nm UV laser is placed in between laser beam and sapphire substrate to obtain uniform laser beam power distribution on the sapphire surface, hence to enhance the laser lift-off process yield. The rms (root mean square) surface roughness of the diffuser plate is preferably set up less than 30 μm and sapphire used for the diffuser.

Figure 7:
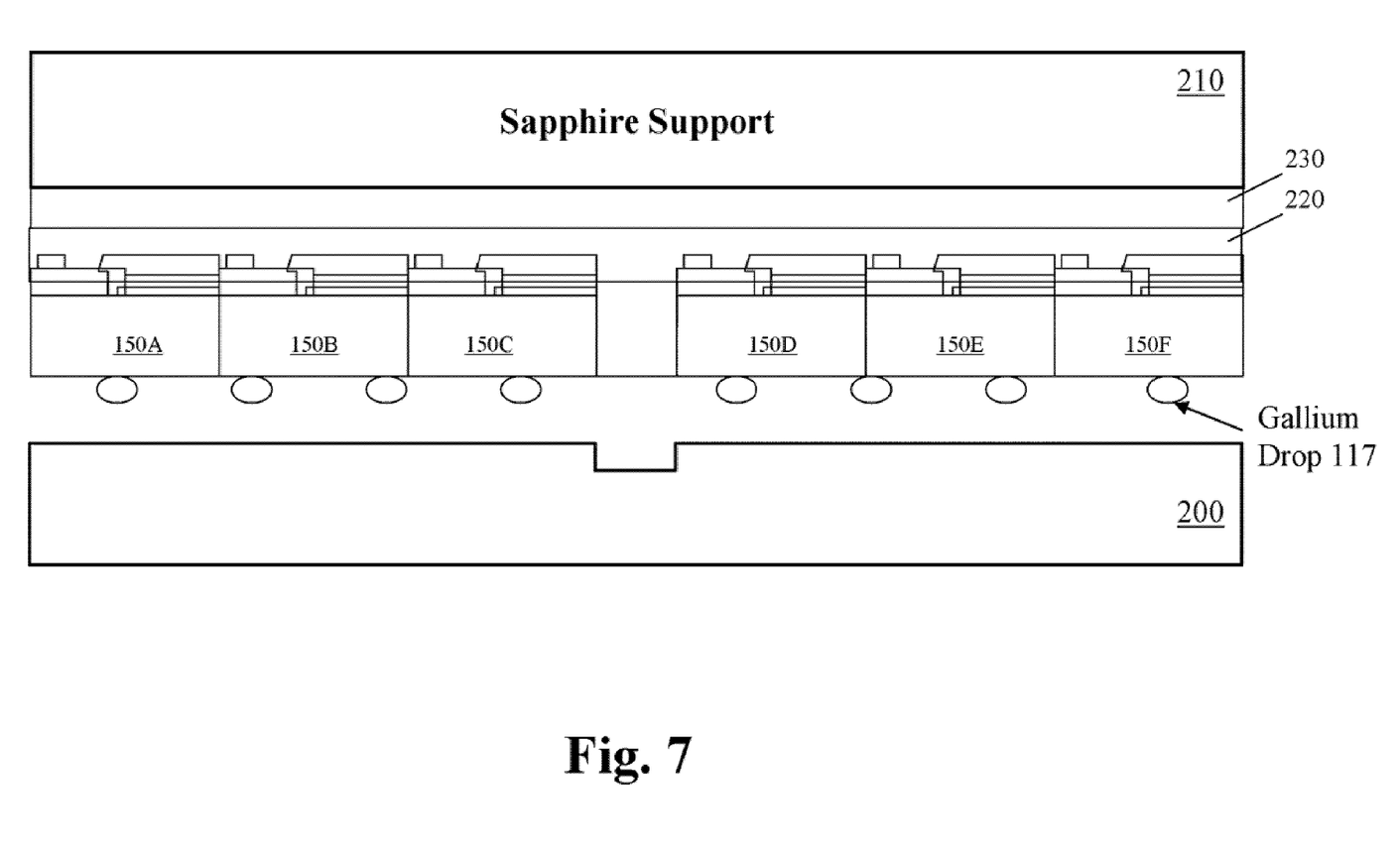
FIG. 7 shows a sapphire substrate removal after laser lift-off.
Figure 8:
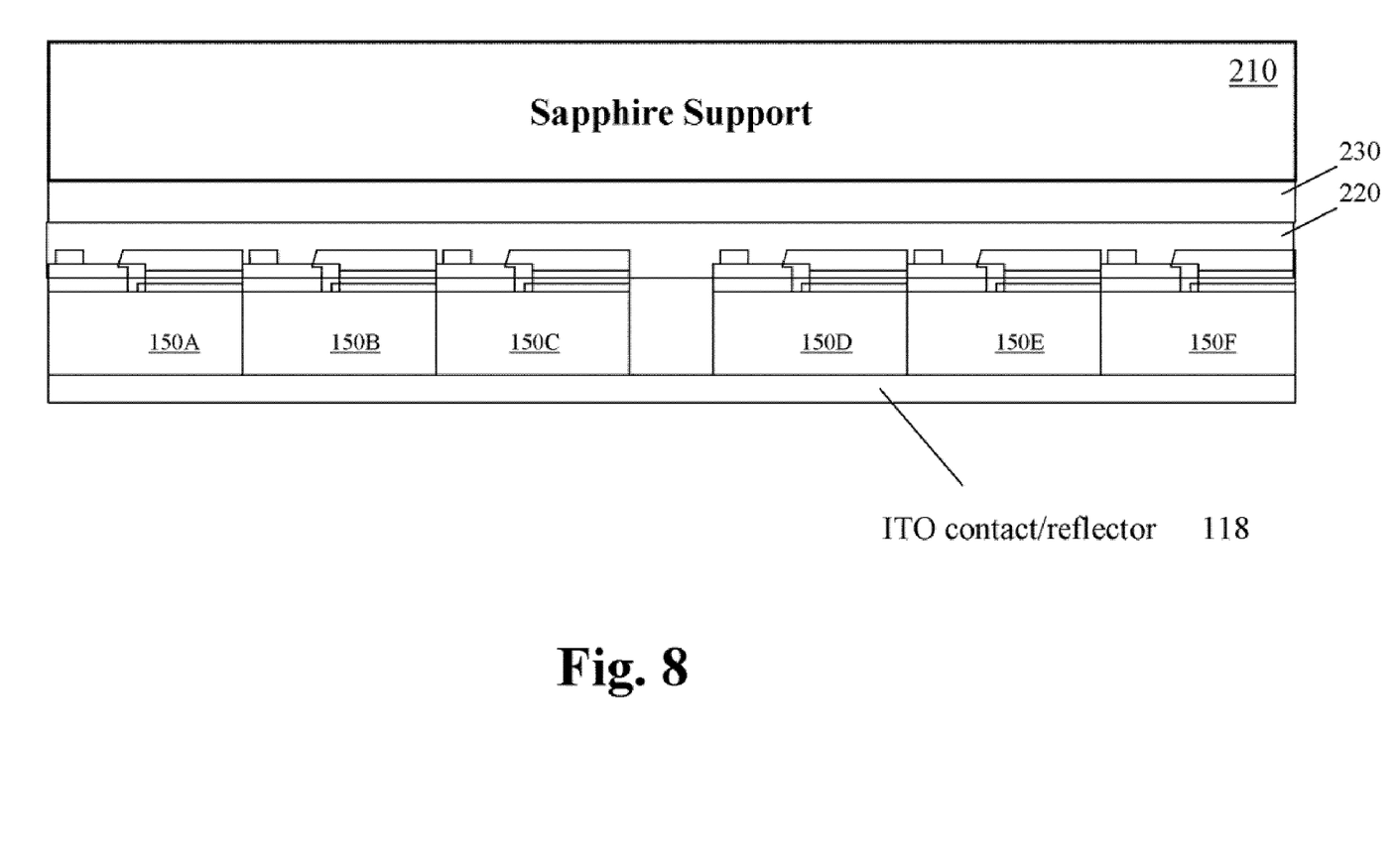
FIG. 8 shows Ga drop removal and surface cleaning, and a transparent ITO reflector/contact formation.

After laser lift-off excess Ca drops resulting from the GaN dissociation during laser lift-off is cleaned with an HCl solution (HCl: $H_2O$=1:1, at room temperature) or boiled HCl vapor for 30 seconds as shown in FIG. 7. Since the Ca melts at room temperature Ga is formed in a liquid state during the laser lift-off and can be easily cleaned with acid solutions. The acid cleaned GaN surface is further cleaned by dry etching, beneficially using inductively coupled reactive ion etching (ICP RIE). To make an atomically flat surface, ICP polishing is also performed on the lifted n-GaN surface. The flat surface is important in producing high reflectivity from a reflective structure that is deposited subsequently since the light output can be increased with a higher reflective surface as shown in FIG. 8.

Obtaining a good optical reflectivity and electrical contact property is important to increase the light extraction and improving electrical properties of the vertical structure device. To meet these requirements, ITO (Indium Tin Oxide) thin film is preferably used for the n-contact and reflector as shown in FIG. 8. Even though ITO is a transparent non-metallic contact, it can form a good n-type contact to the n-GaN, which is comparable to the Ti/Al used for other techniques. Moreover, the high reflectivity of the ITO thin film is ideal to form a reflector for the vertical devices. The reflectivity of ITO is known to be more than 90%, while the best reflectivity of metal thin film used by conventional techniques is known to be at most 60~70%. A transparent conductive and reflective ITO thin film is deposited using electron beam evaporation on the cleaned n-GaN surface. The ITO thin film thickness is chosen to be in the range of 75~150 nm to obtain the optimal reflectivity.

Figure 9:
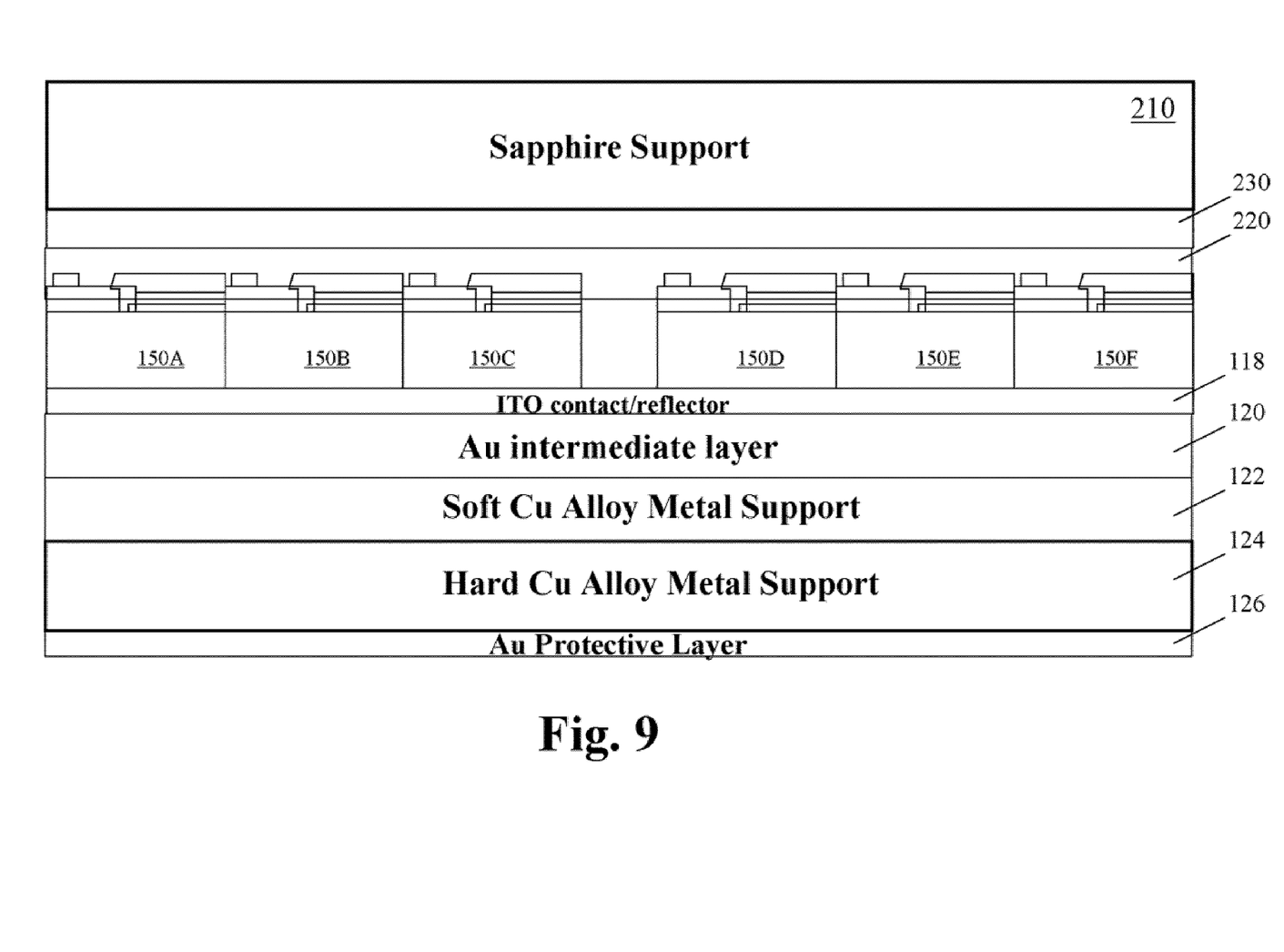
FIG. 9 shows an Au intermediate layer and a thick copper alloy metal support deposition on an ITO contact layer.

To fabricate a vertical structure device having a thin, hard GaN epi layer (less than 10 μm) with thick, soft metal film support (~100 μm), it is important to form an intermediate layer 120 between the two layers to reduce compressive stress that may build up at the interface between GaN epi layer 150 and metal layers 122-126 shown in FIG. 9. Another reason to provide the intermediate layer 120 is that the metallic intermediate layer makes better electroplating characteristics than performing electroplating directly on the non-metallic ITO surface. Approximately 1-μm thick gold (Au) thin film 120 is deposited consecutively on the ITO surface 118 using an electron beam evaporator without removing wafers from the vacuum chamber. In situ consecutive layer deposition is useful to prevent contaminations, which is important to making a good thin film adhesion between ITO and Au layers. In order to improve the adhesion between ITO and Au further, 30~50 nm-thick Cr adhesion layer is deposited in between ITO and Au layers.

In FIG. 9, thick metal support layers 120-126 are deposited by electroplating or electro-less plating. Electroplating or electro-less plating is used because it is a fast and inexpensive deposition technique compared to conventional deposition methods. This is important for mass production of the vertical devices in terms of cost effectiveness. Key functions for the support layer are that the support layers 120-126 not only provides a good rigid mechanical support for the thin GaN epi layer but also provides a good electrical conductivity and heat dissipation. In order to meet these requirements, graded Cu alloy layers are deposited on the Au/Cr adhesion layer.

The first AU buffer layer 120 is deposited prior to the Cu alloy layer. The Au layer 120 can be formed by techniques such as vacuum evaporation and so forth. The Au layer 120 is deposited in order to improve adhesion between the existing layers and the Cu alloy layer. Initially sulfate-base soft copper layer is plated in order to gradually soften stress build up due to thick metal layer. The initial soft Cu alloy layer thickness is set up to ~10 μm. The plating rate is set up to 3~5 μm/hour to form a dense and uniform Cu plating layer. Next to the soft Cu layer 122 and hard Cu layer 124 is plated in order to provide structural stiffness. The plating rate of hard Cu plating is up to 20 μm/hour. For the Cu alloy plating, the metal alloy plating solutions containing tin (Sn) and iron (Fe) are mixed with the Cu sulfate solution to improve the mechanical strength and the electrical conductivity of the Cu support layer. The total thickness of Cu alloy support layer was 70~90 μm (FIG. 9). At the end of the Cu alloy plating, 0.5~1 μm-thick Au layer is electroplated to protect Cu alloy layers from oxidation. The Au protective layer 126 is important to make a good adhesion between individual die and metal-base epoxy during die bonding process and wire bonding process for the packaging the vertical devices.

Figure 10:
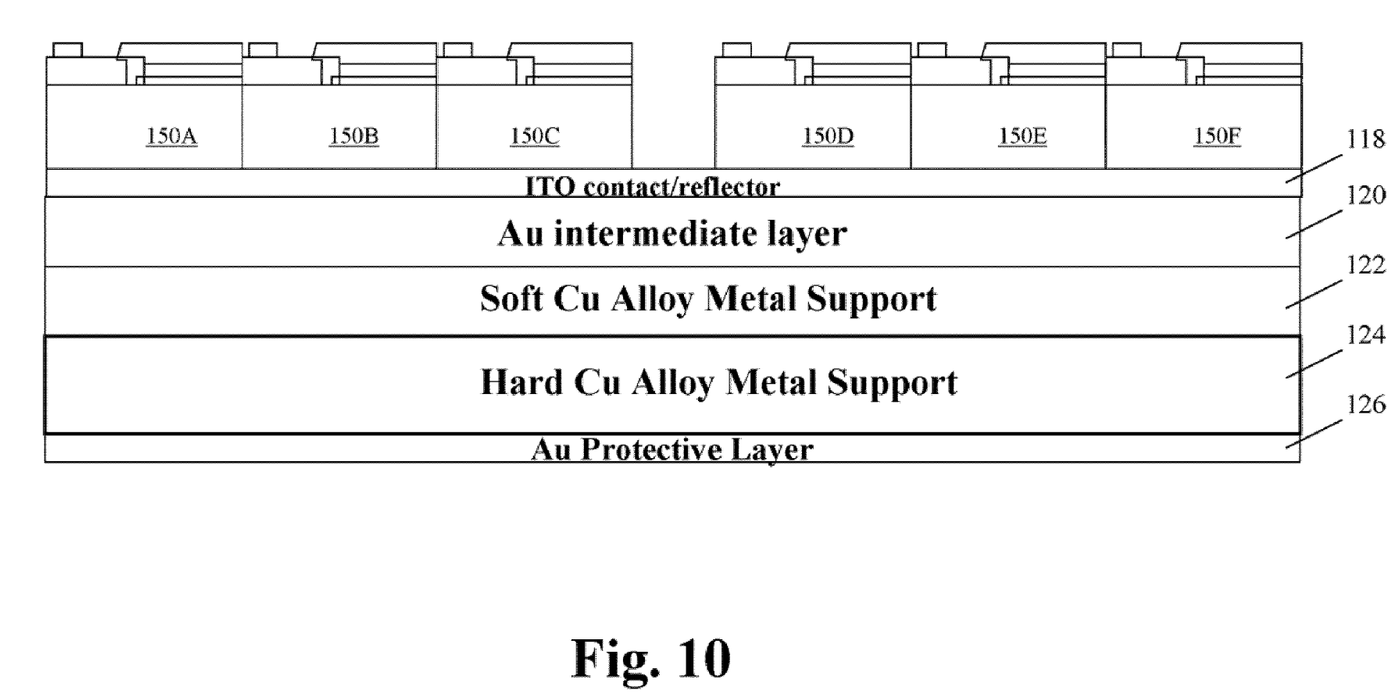
FIG. 10 shows de-bonding of an adhesion glue/epoxy layer and sapphire support removal.

After the thick metal deposition, the sapphire support wafer 210 is removed from the GaN/metal support wafer using solvent and the result is shown in FIG. 10. The de-bonding process includes the steps of soaking the GaN/metal wafer in acetone for 3~5 hours to dissolve the super glue layer from the support sapphire wafer. In order to make the de-bonding process easier and faster, excess metal built up on the edge of the sapphire wafer are trimmed with a mechanical method, such as an edge trimmer or razor blade. A chemical process can also be used. By removing this excess metal, the solvent can more easily to penetrate into the super glue layer and accelerate the de-bonding process. The separated GaN/metal wafers are further soaked and cleaned with isopropanol in an ultrasonic cleaner. The GaN device surface is further cleaned with DI water using rinse and dryer.

Figure 11:
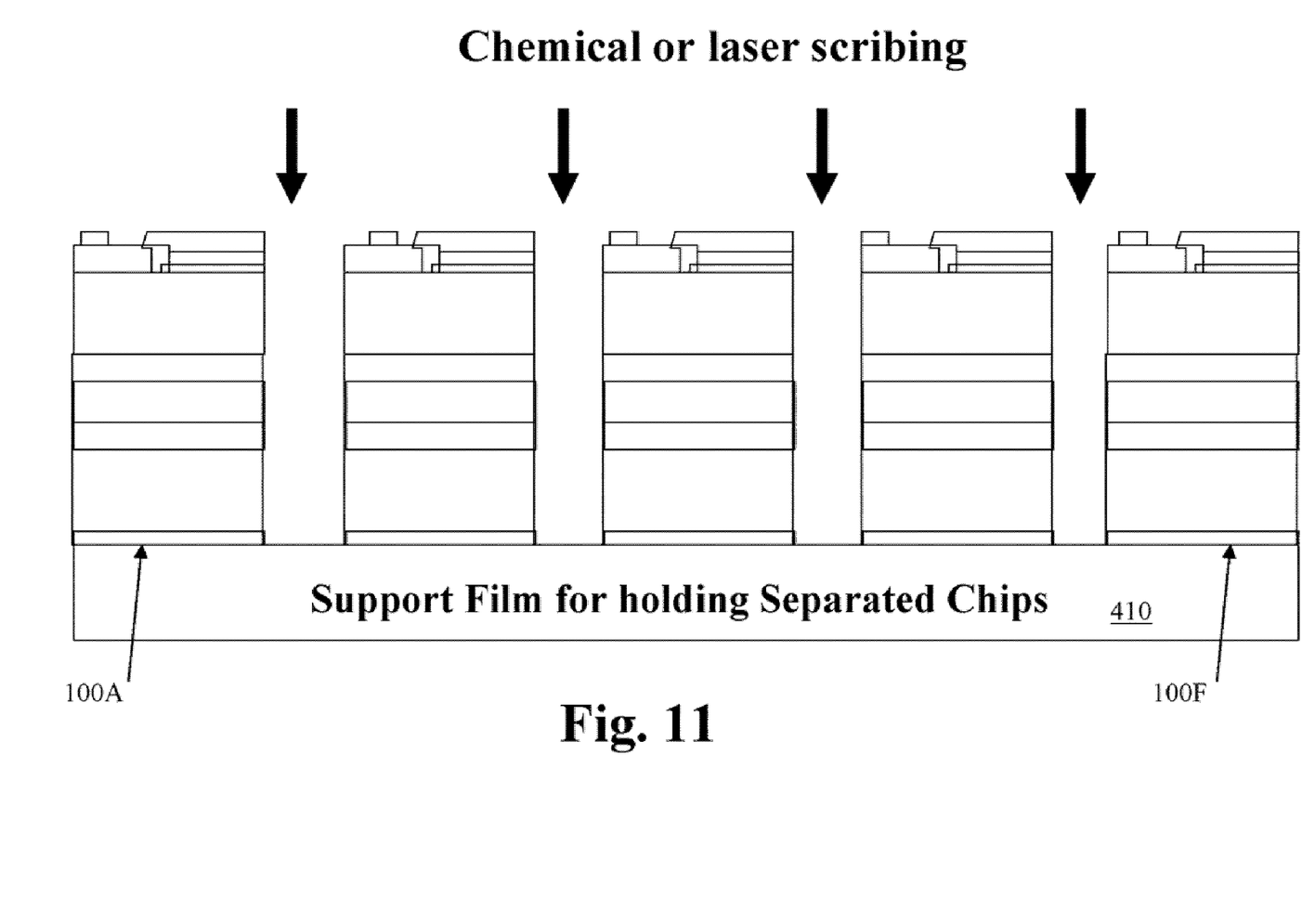
FIG. 11 shows device separation by chemical or laser scribing.
Figure 12:
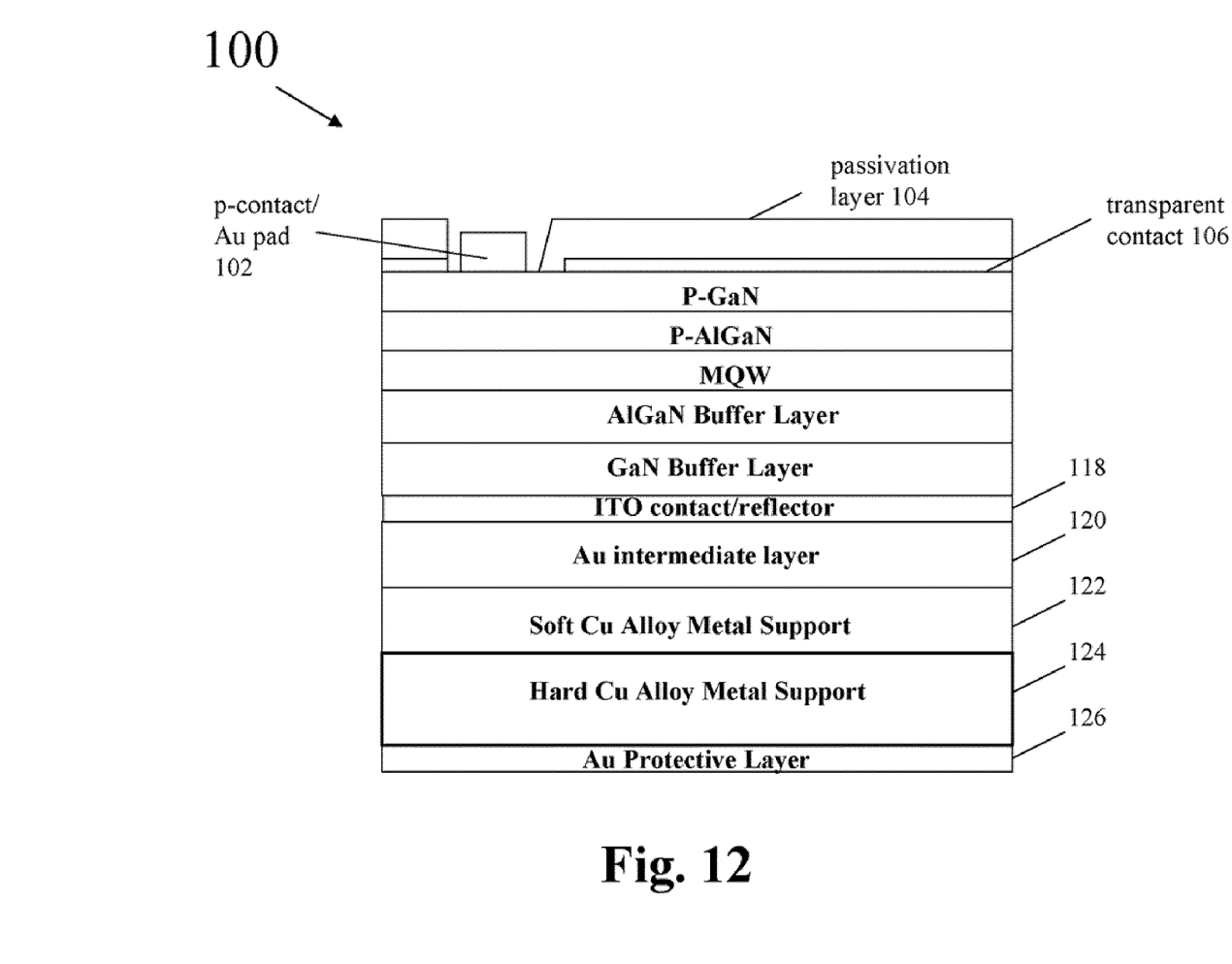
FIG. 12 shows the final vertical device structure according to an embodiment of the invention.

The wafer of FIG. 10 is supported on a film 410 and the individual devices are diced out by scribing as shown in FIG. 1, which can be performed using either a chemical or laser process. FIG. 12 shows the final vertical device structure according to an embodiment of the invention. The result is a high quality laser diode with a high yield relative to other conventional manufacturing techniques.

Advantages of the invention include fabricating vertical structure LEDs suitable for mass production with high reliability and high yield. The invention uses a double bonding process prior to laser lift-off process for the easy separation of the epitaxial layer and the support wafer after laser lift-off and uses an AlGaN damping layer to guard against the high energy shock wave of the laser beam. This additional buffer layer reduces the crack generation caused by high-energy laser beam irradiation on the thin epitaxial thin film.

Having disclosed exemplary embodiments and the best mode, modifications and variations may be made to the disclosed embodiments while remaining within the subject and spirit of the invention as defined by the following claims.

The invention claimed is:
1. A method of fabricating a vertical structure opto-electronic device, comprising the step of:
 fabricating a plurality of vertical structure opto-electronic devices on a crystal substrate;
 removing the substrate using a laser lift-off process; and
 fabricating a metal support structure in place of the substrate, said metal support structure being formed of a material that includes Cu;

wherein fabricating the metal support structure comprises the steps of:
    forming a first metal layer including Cu or Cu alloy over the opto-electronic device; and
    forming a second metal layer including Cu or Cu alloy over the first metal layer;
wherein the forming the first metal layer forms the first metal layer with a slower plating rate than the forming the second metal layer forms the second metal layer.

2. The method of claim 1, wherein the step of fabricating a metal support structure in place of the substrate includes the step of plating the metal support structure using at least one of electroplating and electro-less plating.

3. The method of claim 1, wherein the vertical structure opto-electronic device is a GaN-based vertical structure opto-electronic device, the crystal substrate includes sapphire.

4. The method of claim 2, wherein the vertical structure opto-electronic device is a GaN-based vertical structure opto-electronic device, the crystal substrate includes sapphire.

5. The method of claim 1, further comprising the step of:
    fabricating a buffer layer between the opto-electronic devices and the metal support structure.

6. The method of claim 2, further comprising the step of:
    fabricating a buffer layer between the opto-electronic devices and the metal support structure.

7. The method of claim 3, further comprising the step of performing ICP RIE etching and polishing on the lifted GaN wafer, wherein the etching and polishing exposes and produces an atomically flat surface of pure n-GaN, and wherein the flat surface is particularly beneficial in producing high reflectivity from a reflective structure to be subsequently deposited.

8. The method of claim 3, further comprising the step of depositing a transparent conductive reflective layer using electron beam evaporation on the bottom of the structure, wherein ITO (Indium Tin Oxide) is preferably used for the n-contact is reflector.

* * * * *